United States Patent
Ohtani et al.

(10) Patent No.: US 6,545,921 B2
(45) Date of Patent: Apr. 8, 2003

(54) SEMICONDUCTOR MEMORY DEVICE ALLOWING SPARE MEMORY CELL TO BE TESTED EFFICIENTLY

(75) Inventors: Jun Ohtani; Katsumi Dosaka, both of Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/754,123

(22) Filed: Jan. 5, 2001

(65) Prior Publication Data

US 2002/0003732 A1 Jan. 10, 2002

(30) Foreign Application Priority Data

Jul. 7, 2000 (JP) ........................................ 2000-207151

(51) Int. Cl.[7] .............................. G11C 7/00; G11C 29/00
(52) U.S. Cl. ........................ 365/201; 365/200; 365/222
(58) Field of Search ................................. 365/201, 200, 365/230.03, 222

(56) References Cited

U.S. PATENT DOCUMENTS

| 5,293,386 | A | * | 3/1994 | Muhmenthaler et al. ..... 365/201 |
| 5,636,167 | A | | 6/1997 | Lee et al. |
| 5,708,612 | A | * | 1/1998 | Abe ........................... 365/200 |
| 5,764,576 | A | | 6/1998 | Hidaka et al. |

* cited by examiner

*Primary Examiner*—Huan Hoang
(74) *Attorney, Agent, or Firm*—McDermott, Will & Emery

(57) ABSTRACT

A first selector circuit selectively outputs eight of a plurality of data read from a regular memory cell array, to correspond to the number of data output for one read operation in a testing operation. A second selector circuit selectively outputs eight of a plurality of data read from a spare memory cell array. A third selector circuit in a test mode of operation receives an output of the first selector circuit and that of the second selector circuit and when the operation test of interest is to be conducted for a spare memory cell the third selector circuit outputs to a tester apparatus the output of the second selector circuit as testing output data TDout.

9 Claims, 13 Drawing Sheets

SEMICONDUCTOR MEMORY DEVICE ALLOWING SPARE MEMORY CELL TO BE TESTED EFFICIENTLY

BACKGROUND OF THE INVENTION

1. Field of the Invention

The present invention relates generally to semiconductor memory devices and particularly to those having a redundant, repairing spare memory cell.

2. Description of the Background Art

Recently there has been provided a semiconductor memory device having a memory cell array configuration to provide a wide data I/O width to accommodate some applications, such as an image processing requiring a wide memory band width.

Representatively, there has been developed a merged DRAM/logic with a logic portion and a dynamic random access memory (DRAM) both mounted on a single chip. In this memory, an I/O pin and an external bus that conventionally exist between a processor portion and a DRAM core can be eliminated to allow data to be transferred with high degree of freedom and a large number of global data input/output lines allowing data to be simultaneously input/output to/from the DRAM core can be provided to achieve a wide data I/O width.

In a merged memory/logic a logic portion and a DRAM core have much more global data input/output lines arranged therebetween than in a general-purpose memory, reaching more than 200 or more than 500 in number. In a merged memory/logic, a memory core incorporated therein is tested using data transmitted on such global data input/output lines, although a memory tester or a similar external test apparatus can only make a decision on limited data at a time. Furthermore, to efficiently test an operation a plurality of memory cores need to be tested simultaneously in parallel.

As such, the merged memory/logic typically has mounted therein a circuit operating in the operation test to select some of a large number of global data input/output lines arranged in parallel and output to an external test apparatus the data transmitted on the selected global data input/output line.

Furthermore, a large-scale memory core mounted in a merged memory/logic has a spare memory cell provided for each predetermined segment of regular memory cell arrays to repair a defective regular memory cell to improve the yield of the device. In general, a spare memory cell operation test is conducted separately from a regular memory cell operation test. Both of a result of testing a spare memory cell and that of testing a regular memory cell are used for determining a substitution pattern for redundancy to repair a defective memory cell.

A large-scale memory core has a large area occupied by spare memory cells. As such, it is important that not only a regular memory cell operation test but a spare memory cell operation test be conducted efficiently.

FIG. 12 is a block diagram for illustrating conventionally selecting output data in a testing operation. FIG. 12 exemplarily illustrates that in the testing operation, hereinafter also referred to as the "test mode", eight testing output data TDout are output for a single read operation.

With reference to FIG. 12, a memory cell array subject to an operation test is configured of a plurality of memory mats each corresponding to a predetermined segment of a regular memory cell array. FIG. 12 exemplarily shows a memory cell array formed of eight memory mats MT0 to MT7.

256 regular global data input/output lines GIO(0) to GIO(255) are arranged to transmit data input/output to/from a regular memory cell of the memory cell array. Each memory mat is provided with a spare memory cell arranged therefor, and to transmit data input/output to/from a spare memory cell there are provided spare global data input/output lines SGIO(0) to SGIO(7) for memory mats MT0 to MT7, respectively.

Regular global data input/output lines GIO(0) to GIO(255) are divided into a plurality of groups of eight lines, which number corresponds to the number of the data output in the testing operation, and the eight regular global data input/output lines of each group are gathered at a respective one of internal node groups N0–N31. For example, at internal node group N0 are gathered regular global data input/output lines GIO(0) to GIO(7).

To accommodate a spare memory cell operation test, spare select circuits 510-0 to 510-7 are provided for memory mats MT0 to MT7, respectively. Each spare select circuit receives as an input thereof one of the regular global data input/output lines for a single memory mat and a spare global data input/output line and in response to a test mode signal STMOD outputs data transmitted on either one of the regular and spare global data input/output lines. Test mode signal STMOD is activated when a spare memory cell has its operation to be tested in the test mode, and it is otherwise inactivated.

For example, spare select circuit 510-0 receives regular global data input/output line GIO(0) and spare global data input/output line SGIO(0) and outputs data transmitted on spare global data input/output line SGIO(0) for active mode signal STMOD and data transmitted on regular global data input/output line GIO(0) for inactive mode signal STMOD.

Spare select circuits 510-0 to 510-7 operate in response to the common mode control signal STMOD. As such, if a spare memory cell has its operation to be tested, in each memory mat for any one of the plurality of node groups there can be read the data transmitted on a spare global data input/output line.

A selector circuit 520 selects any one of internal node groups N0 to N31 in response to select signals SEL0 to SEL4 and outputs eight data corresponding to the selected internal node group.

If a spare memory cell has its operation to be tested, select signals SEL0 to SEL4 can be changed to select internal node groups N0, N4, . . . , N28, corresponding to spare select circuits 510-0 to 510-7, successively one at a time, to output data output from each memory mat and transmitted on a spare global data input/output line to an external testing apparatus.

If in such a configuration as above a spare memory cell has its operation tested, however, of eight testing output data from selector circuit 520 only one data corresponds to a spare memory cell and the other seven data are irrelevant to the spare memory cell operation test. This means that testing data are uselessly output. In the FIG. 12 configuration, outputting the data transmitted on all of spare global data input/output lines SGIO(0) to SGIO(7) requires performing a read operation eight times. As such, the spare memory cell operation test is time-consuming. Furthermore, of a plurality of data output from selector circuit 520 the data output corresponding to a spare memory cell needs to be recognized by an external testing apparatus. This complicates a program in conducting the operation test.

In testing a spare memory cell, generating the test mode has a disadvantage, as will be described below.

FIG. 13 is a block diagram for illustrating conventionally decoding a command.

With reference to FIG. 13, any one of $2_3$=eight commands is produced according to a combination in level of three command control signals of a row address strobe signal /RAS, a column address strobe signal /CAS and a write enable signal /WE.

The produced command is any one of no-operation command (NOP), an activation command (ACT), a read command (READ), a write command (WRT), a precharge command (PRE), a mode set command (MST), an auto-refresh command (AREF) and a self-refresh command (SREF).

The group of these commands are produced by a logic gate group LG50. If mode set command MST is produced, a mode set sequence is also started. In the mode set sequence, one of a plurality of modes set in a mode table 530 is selected according to a combination in level of address signals A0 to A10 input to an address terminal.

When read command READ is produced, mode table 530 is referred to to selectively perform either one of an operation reading a regular memory cell and that reading a spare memory cell. Similarly, when write command WRT is produced, the mode table is referred to to perform an operation writing data to either one of a regular memory cell and a spare memory cell.

FIG. 14 is timing plots for illustrating a spare memory cell operation test based on conventionally decoding a command.

With reference to FIG. 14, at each of times T0 to T5, each corresponding to a timing at which a clock signal is activated, command control signals are taken in and according to a combination in level of the command control signals a command is produced.

At timing T0 and timing T1 of clock activation a read command READ1 and a read command READ2 are respectively produced for a regular memory cell, and, with a CAS latency of one clock cycle, at time T1 and time T2 output data D1 and D2 are output corresponding to read commands READ1 and READ2, respectively.

Testing an operation of a spare memory cell array requires starting the mode set sequence to change a selection of mode table 530. At time T2, a command control signal and an address signal have their respective signal levels set as appropriate to produce mode set command MST and mode table 530 has a mode selection switched to a spare mode provided to access the spare memory cell array.

Thereafter when at time T3 and time T4 read commands READ3 and READ4 are produced a spare memory cell can be read. At time T4 and time T5, from the spare memory cell there can be output testing output data D3 and D4.

Thus, switching from a normal read command for a regular memory cell to a read command for a spare memory cell requires performing a mode set sequence independently requiring one clock cycle. As such, a regular memory cell and a spare memory cell cannot be accessed in successive clock cycles. As such, there cannot be conducted a test examining how a normal word line for a normal memory cell and a spare word line adjacent thereto interfere with each other, a test continuously accessing physically contiguous memory cell rows at predetermined intervals, and the like.

SUMMARY OF THE INVENTION

The present invention contemplates a configuration of a semiconductor memory device capable of efficiently testing an operation of a spare memory cell provided to repair a defective portion of a regular memory cell.

Briefly speaking, the present intention provides a semiconductor memory device outputting N data for one read operation in a test mode, N representing a natural number, including a memory cell array, a plurality of regular data input/output lines, a plurality of spare data input/output lines, a first testing output select circuit, a second testing output select circuit and a third testing output select circuit.

The memory cell array is divided into a plurality of memory mats, each including a plurality of regular memory cells arranged in rows and columns and a plurality of spare memory cells provided to substitute and thus repair a defect of the plurality of regular memory cells. The plurality of regular data input/output lines transmit data input to and output from the plurality of regular memory cells. The plurality of spare data input/output lines transmit data input to and output from the plurality of spare memory cells. The first testing output select circuit in the test mode operates to output N data transmitted on N regular data input/output lines of the plurality of regular data input/output lines. The second testing output select circuit in the test mode operates to output N data transmitted on N spare data input/output lines of the plurality of spare data input/output lines. The third testing output select circuit operates to selectively output either one of an output of the first testing output select circuit and an output of the second testing output select circuit depending on whether the plurality of regular memory cells or the plurality of spare memory cells are to be tested in the test mode.

The present invention in another aspect provides a semiconductor memory device including a memory cell array, a first input node, a second input node and a command decode circuit.

The memory cell array has a plurality of regular memory cells and a plurality of spare memory cells arranged in rows and columns.

The first input node receives a plurality of control signals. The second input node receives in a test mode a voltage level indicating whether the plurality of regular memory cells or the plurality of spare memory cells are to be tested.

The command decode circuit is taking therein an input received by the first input node and an input received by the second input node, and responds to a combination in level of the plurality of control signals and a level in voltage of the second input node to produce an operation command for the memory cell array.

The present invention in still another aspect provides a semiconductor memory device including a memory cell array, a regular word line, a spare word line, a refresh address generation circuit and a word line drive circuit.

The memory cell array has a plurality of regular memory cells and a plurality of spare memory cells arranged in rows and columns. L regular word lines are arranged corresponding to rows of the plurality of regular memory cells, respectively, L being a natural number represented by $2^{M-1} < L \leq 2^M$, M being a natural number. N spare word lines are arranged corresponding to rows of the plurality of memory cells, respectively, L being a natural number less than $2^M$. The refresh address generation circuit generates a refresh address signal of (M+1) bits corresponding to a count value counted up in a predetermined period. The word line drive circuit selectively activates at least one of the L regular word lines and N spare word lines. The word line drive circuit operates in response to the refresh address signal of (M+1) bits when a refresh operation is instructed in a test mode.

As such a main advantage of the present invention is that in the test mode only read data transmitted on a spare data input/output line can be selectively output and a spare memory cell can thus be tested in a reduced period of time.

Furthermore, a clock cycle for switching modes is not required in switching a subject of an operation test between the regular memory cell array and the spare memory cell array. As such, in the test mode the regular memory cell array and the spare memory cell array can be successively accessed.

Furthermore, a refresh operation can be performed according to a refresh address larger by one bit than the number of bits corresponding to the number of regular word lines. As such, a refresh operation test for a regular word line and that for a spare word line can be collectively performed. Thus a spare memory cell can be tested efficiently.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Hereinafter the embodiments of the present invention will be described with reference to the drawings.

First Embodiment

Figure 1:
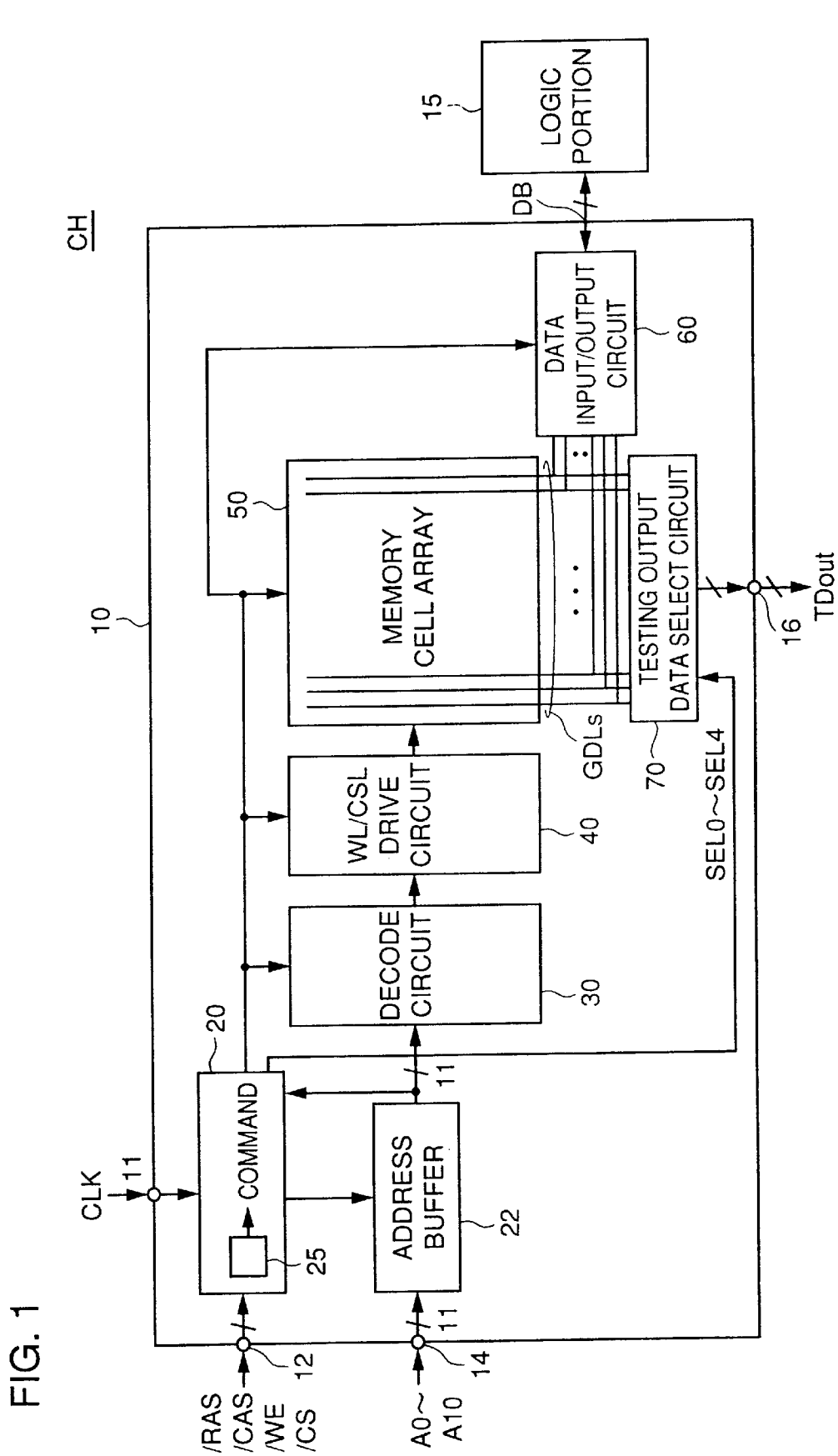
FIG. 1 is a block diagram showing a configuration of a semiconductor memory device 10 in a first embodiment of the present invention.

FIG. 1 is a block diagram showing a configuration of a semiconductor memory device 10 in a first embodiment of the present invention.

In FIG. 1, semiconductor memory device 10 is mounted on the same chip CH as a logic portion 15, configuring a so-called merged memory/logic. Semiconductor memory device 10 and logic portion 15 communicate data therebetween via a data bus DB.

Semiconductor memory device 10 includes a clock input node 11, a command control signal input node 12, an address signal input node 14, a control circuit 20, an address buffer 22, a decode circuit 30 and a WL/CSL drive circuit 40, a memory cell array 50, a data input/output circuit 60, a testing output data select circuit 70, and a testing data output node 16.

Clock input node 11 receives a clock signal CLK to synchronously operate semiconductor memory device 10. The clock signal repeats an inactive state (a low level) and an active state (a high level) in a predetermined period.

Command control signal input node 12 receives command control signals such as a row address strobe signal /RAS, a column address strobe signal /CAS, a write enable signal /WE, a chip select signal /CS and the like. Address signal input node 14 receives for example the 11 bits of address signal including address bits A0 to A10. Address bits A0 to A10 are transmitted via address buffer 22 to decode circuit 30.

Control circuit 20 includes a command decoder 25 which responds to a timing at which clock signal CLK is activated (a timing at which clock signal CLK transitions from low to high) by taking in command control signals via command control signal input node 12 and responds to a combination in level of the taken command control signals by generating a command. Control circuit 20 outputs various control signals corresponding to the generated command, to generally control the operation of semiconductor memory device 10.

Decode circuit 30 at a timing indicated by control circuit 20 performs a decoding operation based on address bits A0 to A10 received from address buffer 22. WL/CSL drive circuit 40 selectively drives a word line and a column select line (not shown in FIG. 1) arranged in memory cell array 50 and corresponding to a row and a column, respectively.

As will be described in configuration more specifically hereinafter, memory cell array 50 with a word line and a column select line arranged therein has a plurality of memory cells arranged in a matrix for holding data. Memory cell array 50 is provided with a plurality of global data lines GDLs arranged therefor. Data input/output circuit 60 is provided between data bus DB and the plurality of global data lines GDLs to communicate input and output data with logic portion 15.

Testing output data select circuit 70 in a test mode of operation responds to select signals SEL0 to SEL4 by selecting part of data read and transmitted on the plurality of global data lines GDLs, and outputting testing output data TDout. In the first embodiment, eight testing output data TDout are exemplarily, externally output in the test mode. More specifically, data select circuit 70 selects eight of data read and transmitted on the plurality of global data lines GDLs and outputs the selected eight data to testing data output node 16.

In the test mode, testing output data TDout are transmitted to an external test apparatus such as a memory tester. Command control signal input node 12 and address signal input node 14 in the test mode receive a command control signal and an address signal, respectively, that are transmitted from the external test apparatus and in the normal mode of operation receive a command control signal and an address signal, respectively, that are transmitted from logic portion 15.

Memory cell array 50 is configured and global data lines GDLs are arranged, as will now be described in detail hereinafter.

Figure 2:
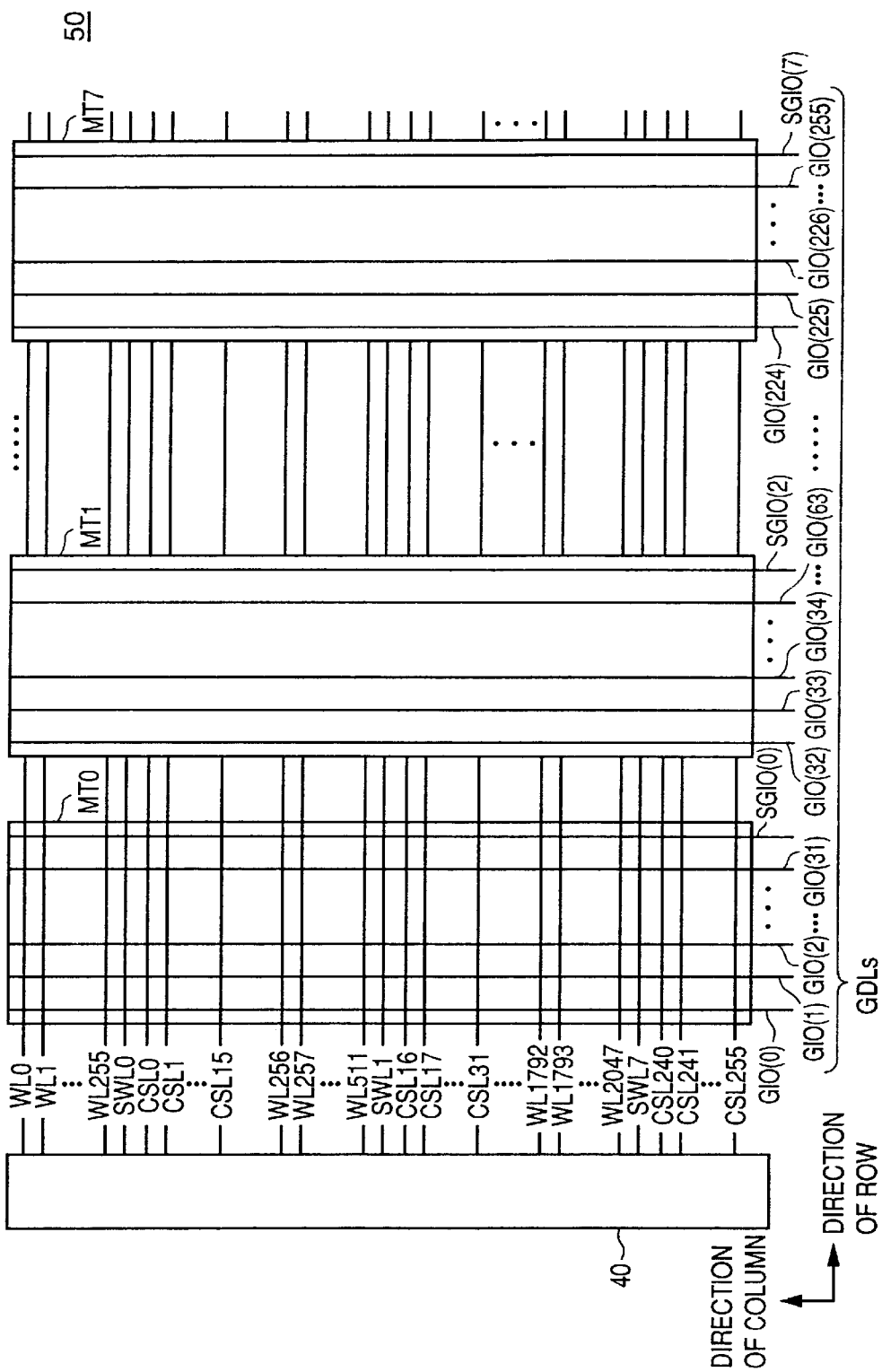
FIG. 2 is a block diagram showing a configuration of a memory cell array 50.

With reference to FIG. 2, memory cell array 50 is divided in a plurality of memory mats along a direction of the columns of memory cells. In FIG. 2, memory cell array 50 is exemplarily configured of eight memory mats MT0 to MT7. A word line and a column select line are arranged along a direction of the rows of memory cells and shared by memory mats MT0 to MT7.

Each memory mat shares 2048 (=$2^{11}$) regular word lines WL0 to WL2047 arranged corresponding to rows of regular memory cells and corresponding in number to the number of bits of a row address signal, and spare word lines SWL0 to SWL8 arranged corresponding to rows of spare memory cells. Similarly, each memory mat shares 256 (=$2^8$) column select lines CSL0 to CSL255 provided for selecting a column. Word lines WL0 to WL2047, spare word lines SWL0 to SWL8 and column select lines CSL0 to CSL255 are selectively activated by WL/CSL drive circuit 40 based on a result of decoding an address signal to select a row and select a column.

For each memory mat in the direction of the columns of memory cells there are arranged 32 regular global data input/output lines and a single spare global data input/output line. For example, for memory mat MT0 are arranged regular global data input/output lines GIO(0) to GIO(31) and a spare global data input/output line SGIO(0). For the entirety of memory cell array 50, there are arranged 256 global data input/output lines GIO(0) to GIO(255) and eight spare global data input/output lines SGIO(0) to SGIO(7), which correspond to the plurality of global data lines GDLs as shown in FIG. 1.

The memory mat is configured as will be described hereinafter. Since each memory mat is similar in configuration, FIG. 3 representatively shows a configuration of memory mat MT0.

Figure 3:
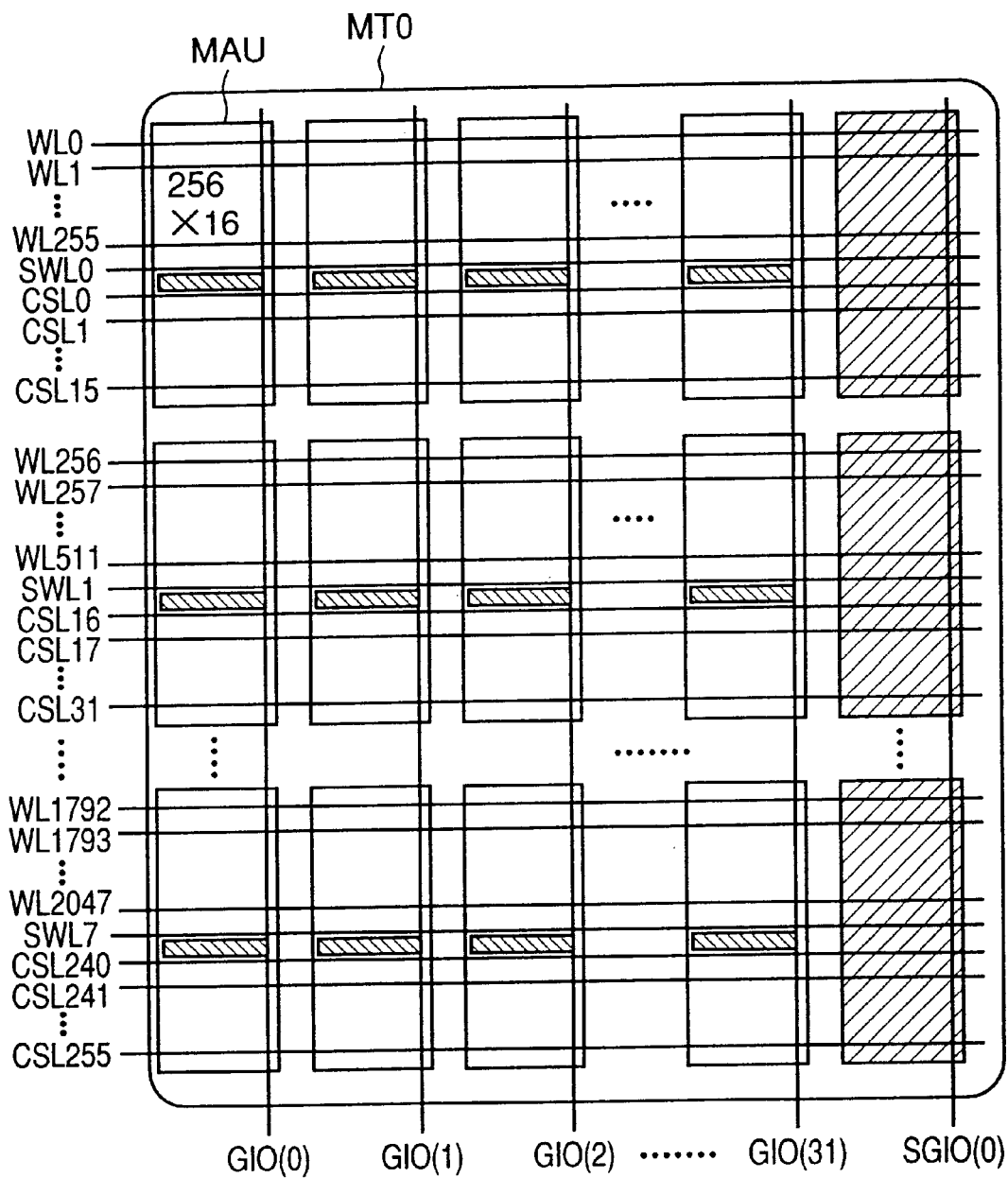
FIG. 3 is a block diagram showing a configuration of a memory mat.

As shown in FIG. 3, memory mat MT0 includes a plurality of memory array unit MAU arranged in a matrix of eight rows and 33 columns.

Each memory array unit MAU has regular memory cells in 256 rows and 16 columns. Memory array units MAUs arranged in the same row share a regular word line, a spare word line and a column select line.

Memory array units MAUs belonging to the same column shares a regular global data input/output line or a spare global data input/output line. As such, for each of 16 memory cell columns a regular global data input/output line or a spare global data input/output line is arranged.

Spare memory cells redundantly provided to repair a defective memory cell are arranged in the memory array units corresponding to spare global data input/output line SGIO(0). As such, each memory mat has spare memory cells arranged in hatched regions, as shown in FIG. 3, i.e., a region in each memory array unit MAU corresponding to a spare word line and the entirety of the memory array units corresponding to spare global data input/output line SGIO (0).

Spare memory cells corresponding to each spare word line are provided for substituting a regular memory cell row in the same memory array unit MAU, whereas spare global data input/output line SGIO(0) collectively substitutes and repairs the group of memory array units MAU corresponding to a single regular global data input/output line.

The memory array unit is configured as will be described hereinafter. Each memory array unit MAU is similar in configuration. As such, FIG. 4 representatively shows a configuration of the memory array unit arranged in FIG. 3 on the uppermost left hand.

Figure 4:
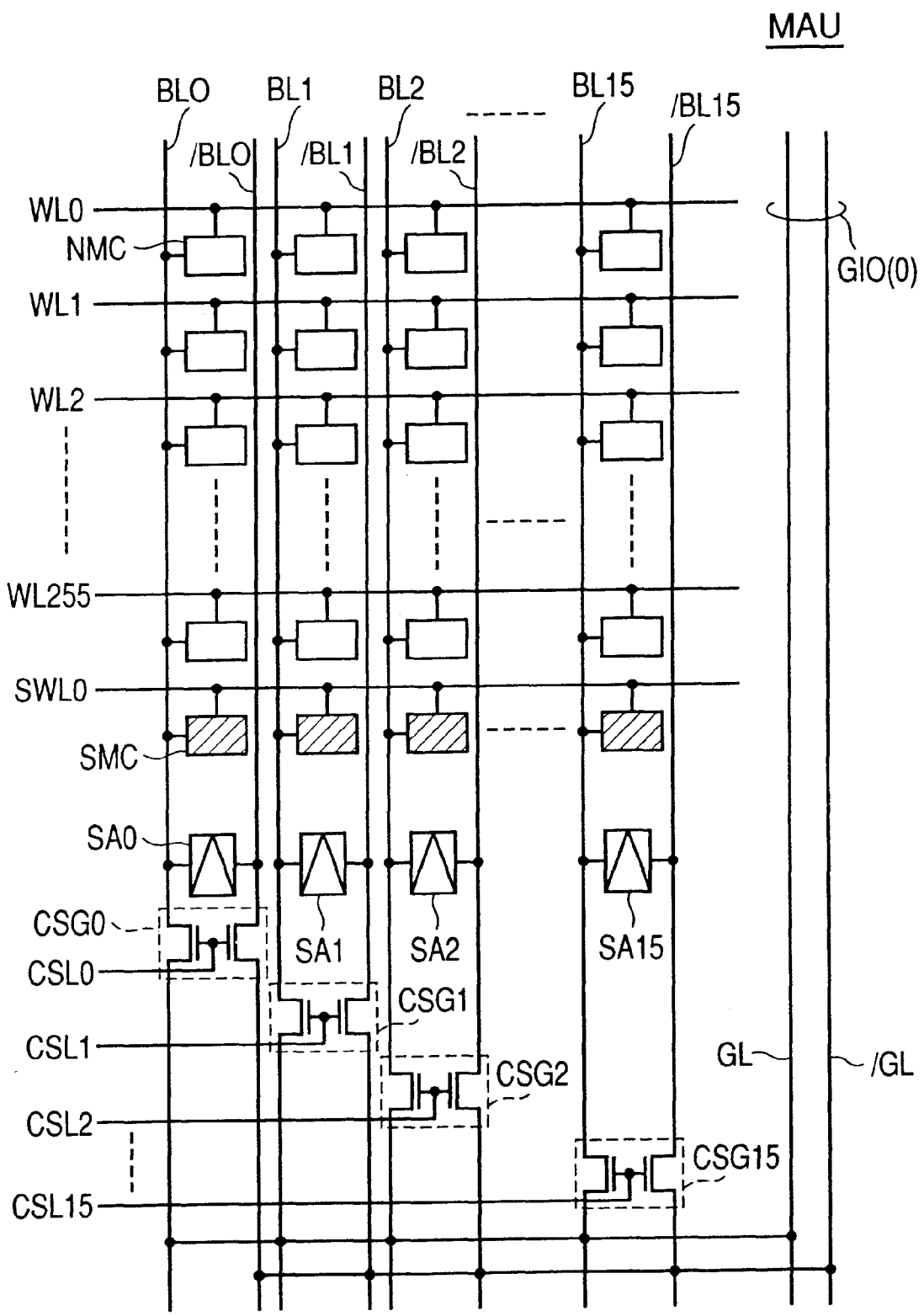
FIG. 4 is a block diagram showing a configuration of a memory array unit.

As shown in FIG. 4, memory array unit MAU includes regular memory cells NMCs arranged in 256 rows and 16 columns and spare memory cells SMCs arranged in one row and 16 columns. Corresponding to the rows of regular memory cells NMCs and the row of spare memory cells SMCs, regular word lines WL0 to WL255 and a spare word line SWL0 are arranged, respectively.

Each spare memory cell SMC is arranged to allow each spare memory cell SMC and regular memory cells NMCs to share a memory cell column. Corresponding to the 16 memory cell columns there are arranged bit line pairs BL0 and /BL0 to BL15 and /BL15, sense amplifiers SA0 to SA15, and column select gates CSG0 to CSG15, respectively.

Bit line pairs BL0 and /BL0 to BL15 and /BL15 receive data held in regular memory cell NMC or spare memory cell SMC that corresponds to an activated one of regular word lines WL0 to WL255 and spare word line SWL0.

Sense amplifiers SA0 to SA15 each amplifies a potential level difference of a bit line pair corresponding thereto. Column select gates CSG0 to CSG15 each responds to a level in potential of a respective one of column select lines CSL0 to CSL15 by connecting a respective bit line pair to regular global data input/output line GIO(0). Regular global data input/output line GIO(0) has data lines GL and /GL transmitting complementary data.

Column select gates CSG0 to CSG15 allow data line GL to be connected to one bit line of a bit line pair selected by column select lines CSL0 to CSL15, i.e., one of bit lines BL0 to BL15, and similarly allow the other data line /GL to be connected to the other, complementary bit line of the selected bit line pair, i.e., one of /BL0 to /BL15.

Spare word line SWL0 replaces a defective one of 256 word lines WL0 to WL255. It is decode circuit 30 that provides an instruction to substitute and thus repair the defective word line with spare word line SWL0. More specifically, decode circuit 30 has programmed therein an address of a word line found to be defective in the test mode. When in the normal mode of operation a programmed defective word line is selected in response to an address signal, decode circuit 30 issues an instruction to activate spare word line SWL0 rather than the defective word line of interest.

Note that memory cell array 50 has the number of memory cell rows that is determined considering that the address signals are 11 bits and typically $2^N$ memory cell rows are arranged for address signals of N bits, wherein N represents a natural number. It is also only for purpose of illustration that 16 columns of memory cells are provided for a single global data line.

It is also only for purpose of illustration that memory cell array 50 is divided into eight memory mats MT0 to MT7 each further divided into memory array units MAUs in eight rows and 33 columns, and a memory cell array can be divided, as appropriate, to correspond for example to the number of columns of memory cells corresponding to the number of global data lines GDLs and a single global data line that are arranged.

Figure 5:
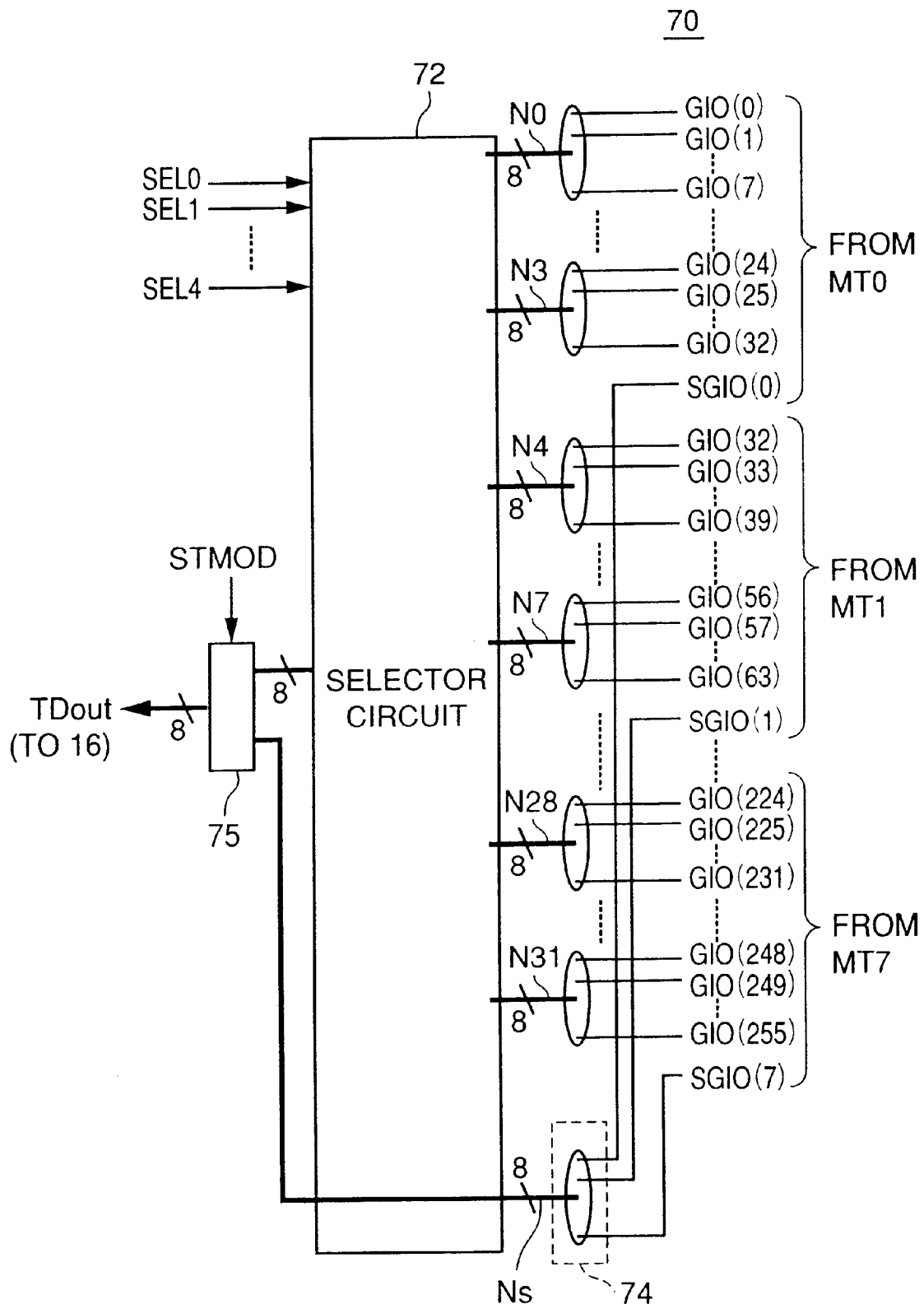
FIG. 5 is a block diagram showing a configuration of a testing output data select circuit 70.

With reference to FIG. 5, regular global data input/output lines GIO(0) to GIO(255) are divided into groups of eight lines, which number corresponds to the number of testing output data TDout. Corresponding to the plurality of groups of eight lines there are arranged internal node groups N0 to N31. For example, to internal node group N0 correspond regular global data input/output lines GIO(0) to GIO(7).

Selector circuit 72 receives select signals SEL0 to SEL4 provided to select any one of internal node groups N0 to N31. The number of select signals SEL0 to SEL4 is determined to correspond to the number of the internal node groups. More specifically, selecting one of 32 internal node groups N0 to N31 entails five select signals SEL0 to SEL4.

Of the 256 data transmitted on regular global data input/output lines GIO(0) to GIO(255), selector circuit 72 selectively outputs eight data corresponding to an internal node group selected in response to select signals SEL0 to SEL4.

Furthermore, a selector circuit 74 is arranged for spare global data input/output lines. Selector circuit 74 is provided to selectively output eight data of a plurality of data transmitted on the spare global data input/output lines.

Note that as configured in the first embodiment the number of global data input/output lines SGIO(0) to SGIO(7) is equal to the number of data output through testing data output node 16 and selector circuit 74 is thus not required to operate to provide a select operation in response to a select signal. More specifically, selector circuit 74 includes an internal node group Ns gathering spare global data input/output lines SGIO(0) to SGIO(7) and transparently outputting eight data transmitted thereto.

Thus, matching the number of spare global data input/output lines to the number of data output for a single read operation in the test operation can simplify the configuration of selector circuit 74 arranged to efficiently test an operation of a spare memory cell.

Testing output data select circuit 70 also includes a selector circuit 75 operating in response to a test mode signal STMOD. As has been described previously, test mode signal STMOD is activated in the test mode when a memory cell has its operation to be tested, and test mode signal STMOD is otherwise inactivated.

When test mode signal STMOD is active, selector circuit 75 receives a signal output from selector circuit 74 and transmits it to testing data output node 16. When test mode signal STMOD is inactive, selector circuit 75 receives a signal output from selector circuit 72 and transmits it to testing data output node 16. As such, in the test mode with a spare memory cell to be tested, testing output data TDout corresponds only to data read from the spare memory cell, and in the test mode with a regular memory cell to be tested, testing output data TDout corresponds only to data read from the regular memory cell.

As such, a spare memory cell operation test can be conducted in a short period of time. Furthermore, it is not necessary for an external test apparatus to identify data output corresponding to a spare memory cell. As such, a spare memory cell operation test can be efficiently conducted.

Second Embodiment

In a second embodiment a description will be made of a configuration allowing a regular memory cell and a spare memory cell to be successively accessed in a test mode.

Figure 6:
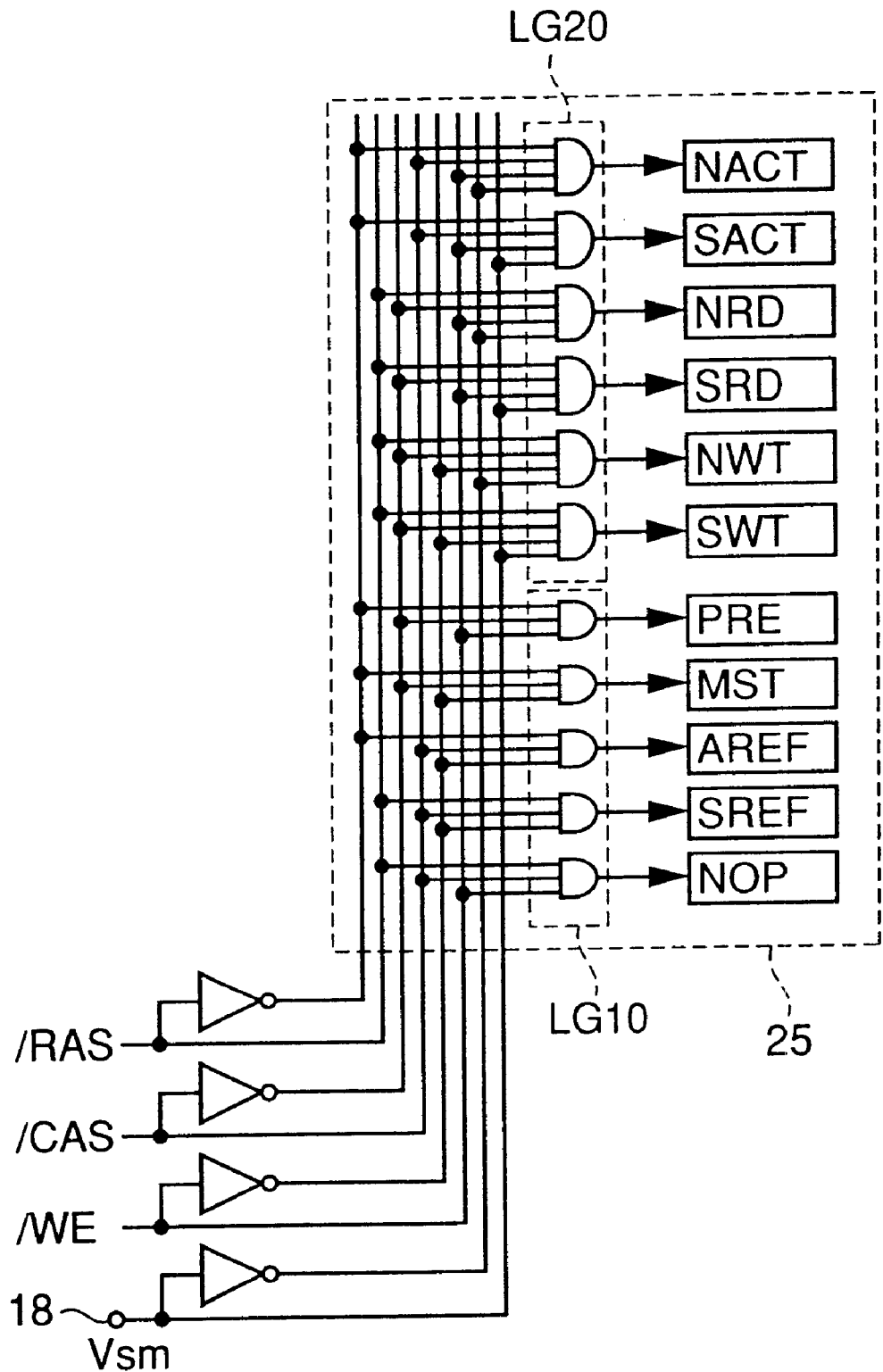
FIG. 6 is a circuit diagram showing a configuration of a command decoder 25 in a second embodiment of the present invention.

With reference to FIG. 6, the second embodiment provides a semiconductor memory device having a spare mode recognition node 18 additionally arranged receiving a high or low potential level in the test mode.

Command decoder 25 includes a logic gate group LG10 producing a command in response to a combination in level of command control signals /RAS, /CAS and /WE, and a logic gate group LG20 producing a command in response to a combination in level of command control signals /RAS, /CAS and /WE and a potential level Vsm of test mode recognition node 18.

Logic gate group LG10 produces a precharge command PRE instructing an operation precharging a data line, a mode set command MST instructing selecting a mode table, an auto refresh command AREF and a self refresh command SREF each instructing a refresh operation, and no-operation command NOP not instructing any particular operation.

Precharge command PRE is produced for signals /RAS and /CAS of logical low and signal /WE of logical high responsibly when a corresponding logic gate outputs a signal set high. Similarly, mode set command MST is produced for signals /RAS, /CAS and /WE of logical low, and auto refresh command AREF is produced for signals /RAS and /WE of logical low and signal /CAS of logical high. Self refresh command SREF is produced for signals /RAS and /CAS of logical high and signal /WE of logical low, and no-operation command NOP is produced for signals /RAS, /CAS and /WE of logical high.

A write command instructing a write operation, a read command instructing a read operation and an activation command instructing the activation of a row select operation for a spare memory cell are produced independently from those commands for a regular memory cell, depending on potential level Vsm of spare mode recognition node 18.

For example, when command control signals /RAS and /WE of logical high and /CAS of logical low indicate a read operation and potential level Vsm is logical high, a read command SRD is produced for a spare memory cell, and when the command control signals similarly indicate a read operation and potential level Vsm is logical low, a read command NRD is produced for a regular memory cell.

Similarly, if command control signals /RAS of logical high and /CAS and /WE of logical low then in response to potential level Vsm applied to spare mode recognition node 18 there is produced either one of a write command NWT for a regular memory cell and a write command SWT for a spare memory cell. As is similar for activation command ACT, corresponding to a same combination in level of the command control signals (/RAS of logical low and /CAS and /WE of logical high) and in response to potential level Vsm of spare mode recognition node 18 there is produced either one of a normal activation command NACT provided for starting an operation selecting a row of regular memory cells and a spare activation command SACT provided for starting an operation selecting a row of spare memory cells.

Figure 13:
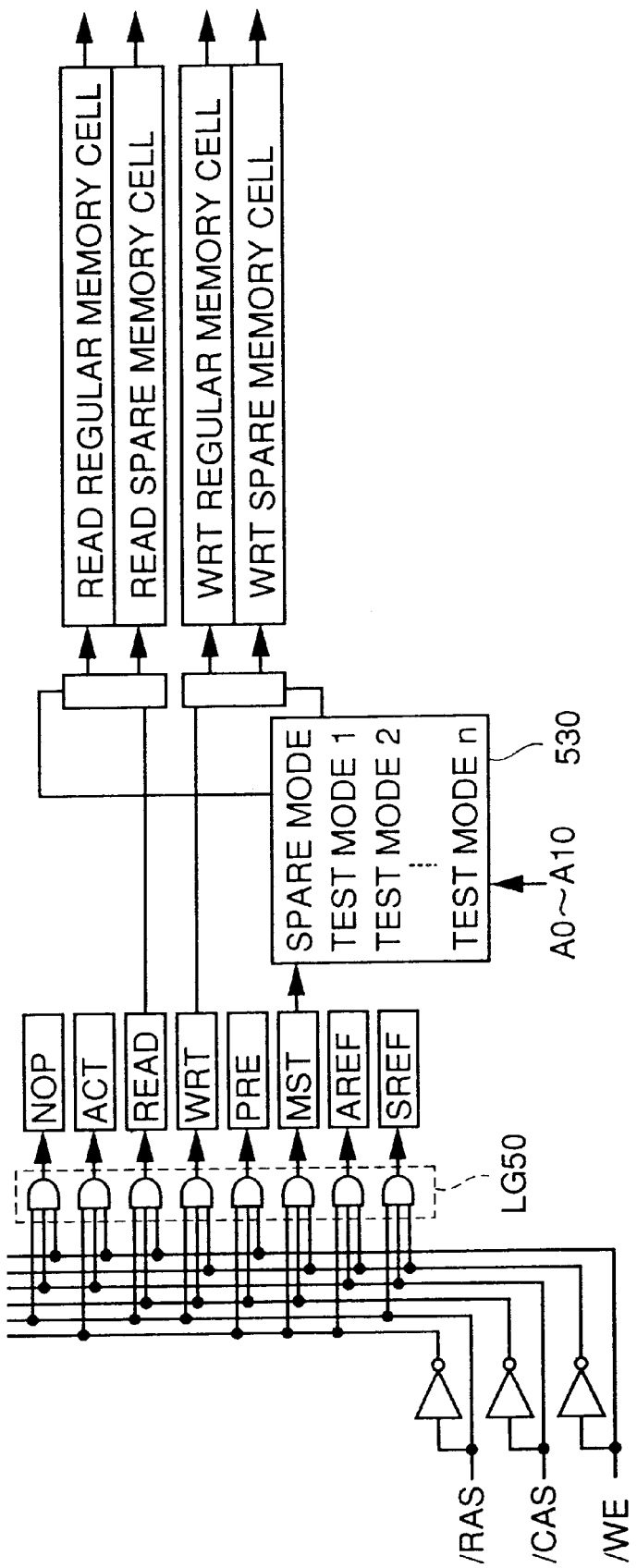
FIG. 13 is a block diagram illustrating conventionally decoding a command.

As such, at a timing of each low to high transition of the clock signal a command for a regular memory cell and a command for a spare memory cell can be selectively produced in the same cycle clock in response to the levels of the command control signals and potential level Vsm of spare mode recognition node 18. As such, it is not necessary to perform a mode setting sequence requiring one clock cycle to change a content of a mode table in switching a subject of the activation command, the read command and the write command between a regular memory cell and a spare memory cell, as shown in FIG. 13.

Figure 7:
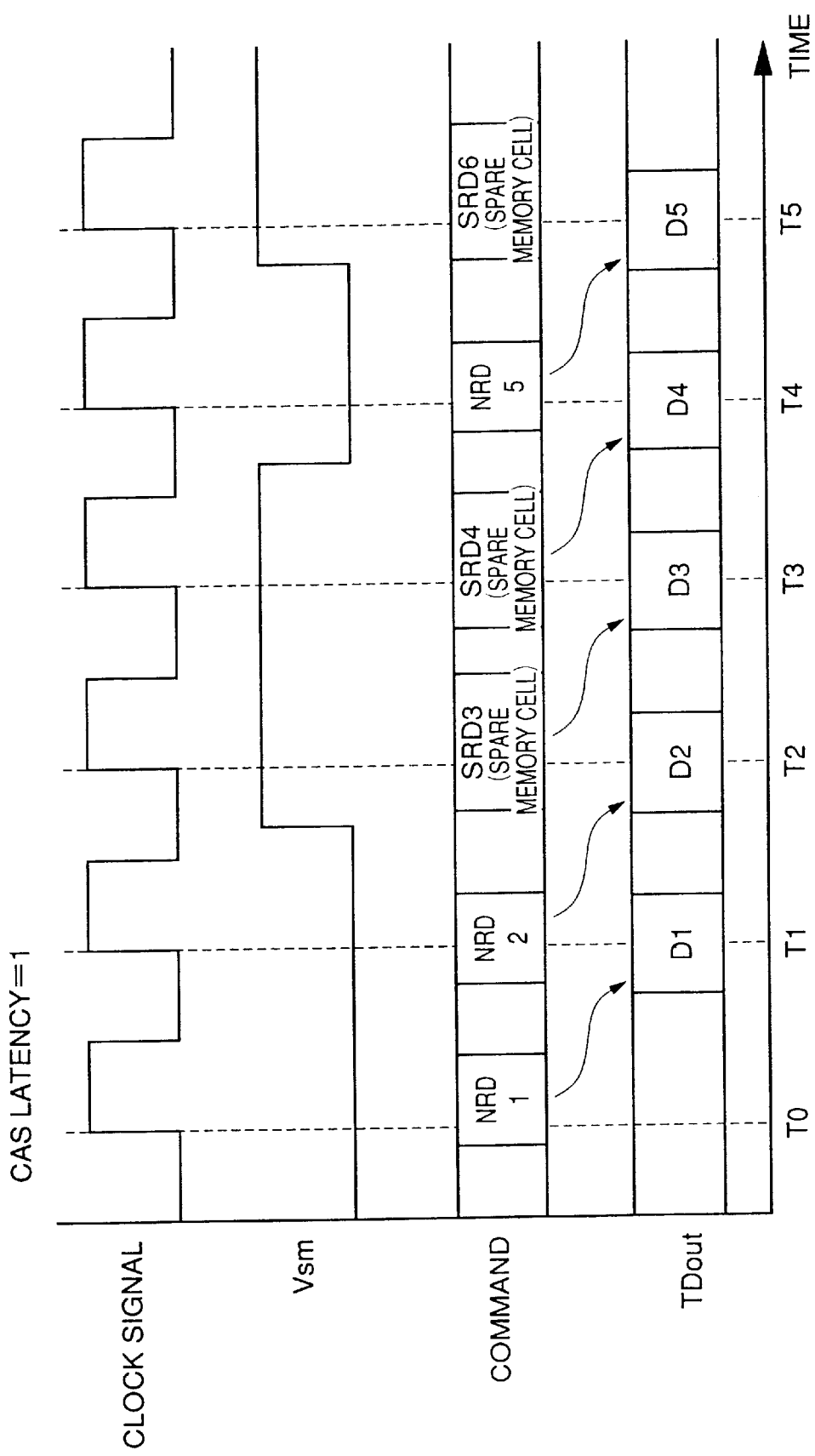
FIG. 7 is timing plots representing a test conducted by command decoder 25 to test an operation of a spare memory cell.

With reference to FIG. 7, command decoder 25 at each timing at which clock signal CLK is activated (a timing of a low to high transition), corresponding to time T0 to time T5, takes in command control signals /RAS, /CAS, /WE and potential level Vsm applied to spare mode recognition node 18 and accordingly produces a command.

For the sake of convenience, at each of time T0 to time T5 command control signals /RAS and /WE are set high and command control signal /CAS is set low to instruct a read operation.

At a timing at which the clock signal is activated at each of time T0 and time T1, spare mode recognition node 18 receives potential Vsm of logical low and read commands NRD1 and NRD2 for a regular memory cell are produced, respectively.

Figure 14:
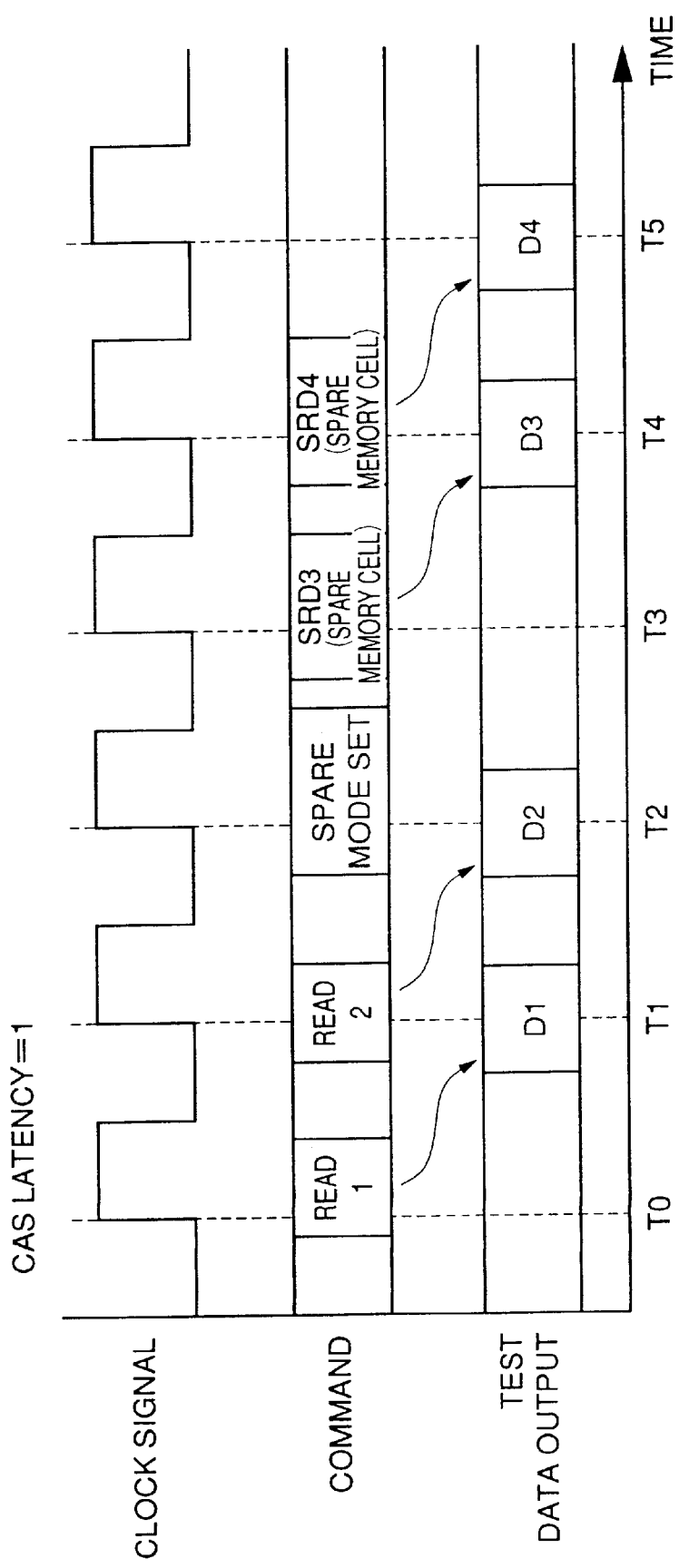
FIG. 14 is timing plots for illustrating a spare memory cell operation test conducted based on conventionally decoding a command.

By transitioning potential level Vsm of spare mode recognition node 18 from low to high between time T1 and time T2, there can be produced immediately at time T2 a read command SRD3 for a spare memory cell. More specifically, it is not necessary to provide one clock cycle to produce mode setting command MST to perform a mode setting sequence to test a spare memory cell, as has been described with reference to FIG. 14. As such, read command NRD2 for a regular memory cell and read command SRD3 for a spare memory cell can be successively produced.

At time T3 potential level Vsm still remains set high and a read command SRD4 is thus produced for a spare memory cell. Between time T3 and time T4 potential level Vsm again transitions from high to low and at time T4 a read command NRD5 is accordingly produced for a regular memory cell.

Then between time T4 and time T5 potential level Vsm is changed from low to high and at time T5 a read command SRD6 can thus be produced again for a spare memory cell.

Corresponding to these read commands, at time T1 to time T5 after one clock cycle corresponding to a CAS latency elapses there can be successively output data read from a spare memory cell and data read from a regular memory cell that are mixed.

Thus in the second embodiment a command decoder allows a test examining how adjacent word lines interfere with each other to be conducted not only in a regular memory cell but also between a regular memory cell and a spare memory cell. Furthermore, there can be conducted a test accessing physically contiguous memory cell rows successively at predetermined intervals to improve a content of a spare memory cell operation test.

Third Embodiment

In a third embodiment a description will be made of an operation refreshing a spare memory cell.

Figure 8:
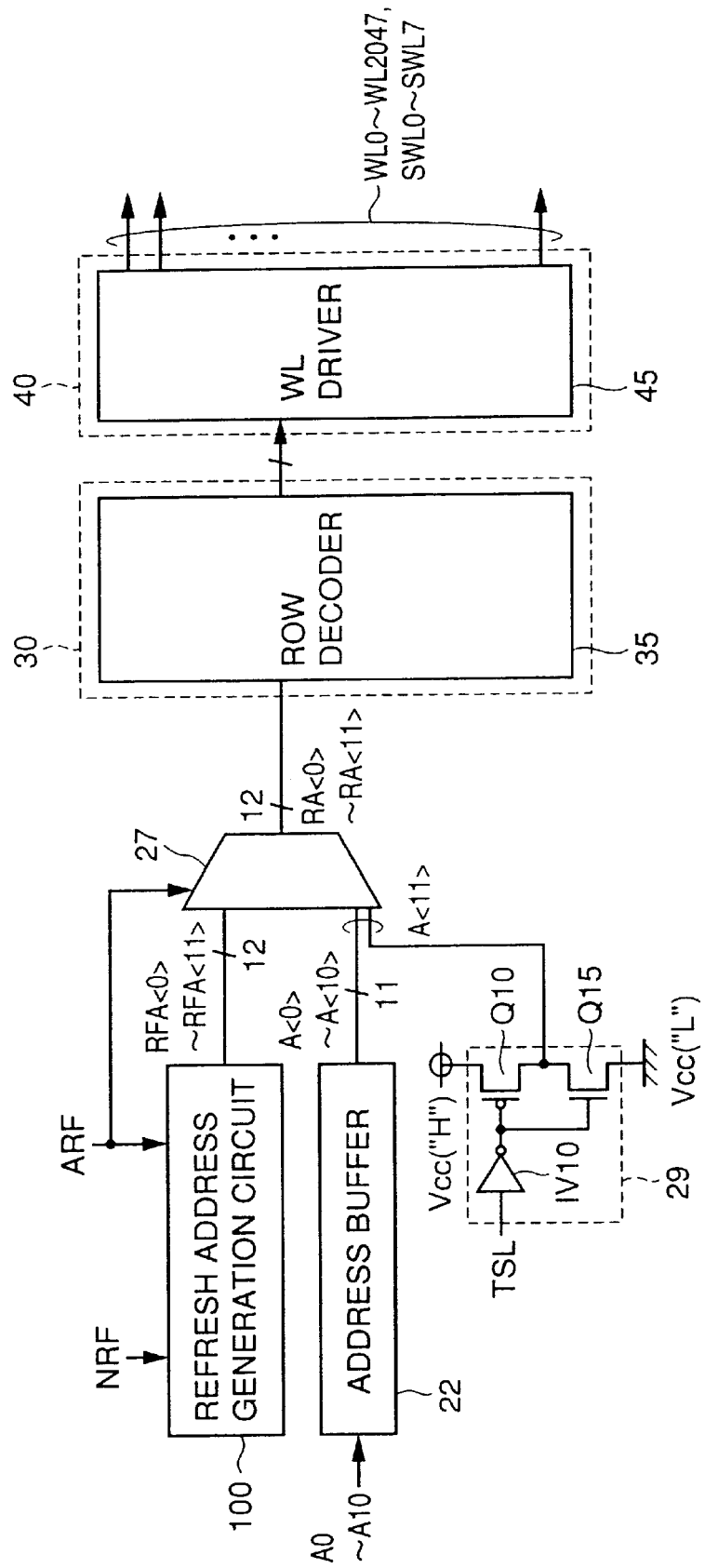
FIG. 8 is a block diagram for illustrating how a refresh address signal is generated in a third embodiment of the present invention.

With reference to FIG. 8 the third embodiment provides a semiconductor memory device having the configuration of the FIG. 1 semiconductor memory device 10 plus a refresh address generation circuit 100, a selector 27 and a spare word line select circuit 29.

Address buffer 22 generates address bits A<0> to A<10> according to address bits A0 to A10 input to address signal input node 14. Spare word line select circuit 29 generates address bit A<11>. Address bit A<11> designates whether a row to be selected is a regular word line or a spare word line. Address bits A<0> to A<10> are provided to select one of ($2^{11}$) regular word lines and one of a spare word line. Hereinafter address bits A<0> to A<11> will also be generally referred to as an internal address signal A<0:11>.

Spare word line select circuit 29 responds to a level of a control signal TSL by setting the address bit A<11> level high or low. Control signal TSL is provided to force a spare word line to be a row to be selected and it is only required to be activated for example in response to the activation command SACT, read command SRD and write command SWD for a spare memory cell.

Spare word line select circuit 29 includes a p-type MOS transistor Q10 and an n-type MOS transistor Q15 coupled in series between a power supply potential Vcc corresponding to the high level of address bit A<11> and a ground potential Vss corresponding to the low level of address bit A<11>. Spare word line select circuit 29 also includes an inverter IV10 inverting the control signal TSL level. Inverter IV10 outputs a signal which is in turn input to transistors Q10 and Q15 at their respective gates. In the coupled transistors Q10 and Q15 at their drain is generated address bit A<11>.

When control signal TSL is active or logical high, address bit A<11> has a level set high and any one of spare word lines SWL0 to SWL7 is selected in response to externally input address signals A0 to A10. When control signal TSL is inactive or logical low, address bit A<11> has a level set low and any spare word line is not selected and any one of regular word lines WL0 to WL2047 is selected in response to a combination of externally input address signals A0 to A10.

Refresh address generation circuit 100 operates in response to a refresh activation signal ARF activated responsively when self refresh command SREF or auto refresh command AREF is produced.

Refresh address generation circuit 100 outputs internal to the semiconductor memory device the 12 bits of refresh address signal including refresh address bits RFA<0> to RFA<11> for designating a word line to be refreshed. Note that hereinafter multi-bit signals such as refresh address signal including refresh address bits RFA<0> to RFA<11> will also be generally referred to as RFA<0:11>.

In refresh address signal RFA<0:11> a count value is reflected that is counted up in a predetermined period. Providing a refresh address signal having a number of bits set one bit more than the number of bits of externally input address signals A0 to A10, allows spare word lines SWL0 to SWL7, arranged for a spare memory cell, to be subject to an automatic refresh operation.

While refresh address generation circuit 100 starts a counting-up operation in response to refresh activation signal ARF, if in a mode other than the test mode for a spare memory cell the most significant bit RFA<11> is fixed to be logical low then refresh address generation circuit 100 can be used in common for the test mode of operation and the normal mode of operation.

In this case, whether a mode is the test mode for a spare memory cell can be determined for example by referring to potential level Vsm of spare mode recognition node 18 as described in the second embodiment.

In FIG. 8, of decode circuit 30 and WL/CSL driver 40 a function responsible for selecting a row is extracted to indicate a row decoder 35 and a WL driver 45. WL driver 45 refers to a result obtained from row decoder 35, to selectively activate regular word lines WL0 to WL2047 and spare word lines SWL0 to SWL7.

Selector 27 responds to a level of refresh activation signal ARF by outputting as row address signals RA<0> to RA<11> either one of refresh address signal RFA<0:11> generated by refresh address generation circuit 100 and an internal address signal A<0:11> generated by address buffer 11 and spare word line select circuit 29. Row address signal RA<0:11> is transmitted to row decoder 35.

Figure 9:
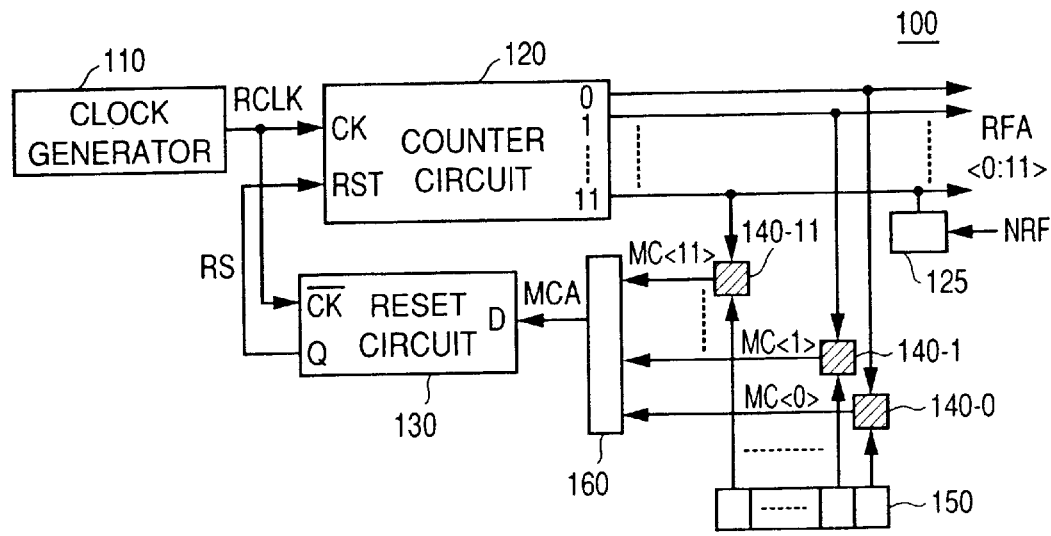
FIG. 9 is a block diagram showing a configuration of a refresh address generation circuit 100.

With reference to FIG. 9, refresh address generation circuit 100 includes a clock generator 110 generating a refresh clock RCLK, a count circuit 120 counting up a count value in response to a timing at which refresh clock RCLK is activated, to output refresh address signal RFA<0:11> with the count value reflected therein, a reset circuit 130 resetting a count value of counter circuit 120, a register circuit 150 holding the data corresponding to the value of the sum of the number of regular word lines and the number of spare word lines, compare circuits 140-0 to 140-11 comparing refresh address signal RFA<0:11> with the data held in register circuit 150, and a match detection circuit 160 responding to a result obtained from compare circuits 140-0 to 140-11 by generating a match detection signal MCA for activating reset circuit 130.

Figure 10:
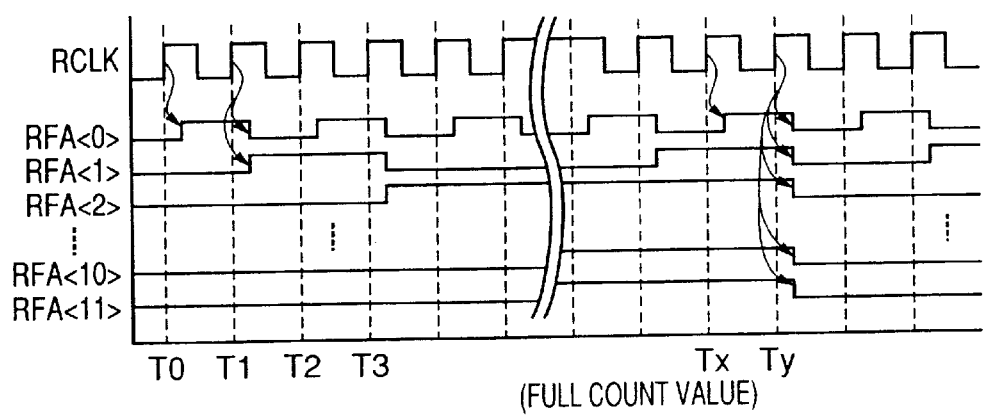
FIG. 10 is timing plots for illustrating an operation of a counter circuit 120.

With reference to FIG. 10, clock generation circuit 110 generates refresh clock RCLK repeating an active state (of logical high) and an inactive state (of logical low) periodically at predetermined intervals.

In response to each timing at which refresh clock RCLK is activated (at a timing of refresh clock RCLK transitioning from low to high) a count value is incremented by one and there also varies a value of each bit of refresh address signal RFA<0:11> serving as a count signal corresponding thereto.

The refresh address signal has the least significant bit RFA<0> alternately activated (from low to high) or inactivated (from high to low) responsively at each timing at which clock signal CLK is activated. Of the refresh address signal, RFA<1> and RFA<2> are activated or inactivated alternately once whenever clock signal CLK is activated twice and four times, respectively. Thus, the refresh address signal has an ith bit RFA<i> alternately activated or inactivated whenever clock signal CLK is activated $2^i$ times, wherein i represents an integer of 0 to 11.

Thus, refresh address signal RFA<0:11> is counted up by one responsively at each timing at which refresh clock RCLK is activated. At a time Tx when the refresh clock is activated for a total of $2^{12}$ times, a fully counted value is attained and refresh address signal RFA<0:11> has its bits all set high. Following time Tx at a time Ty when refresh clock RCLK is subsequently activated, a count value is initialized and refresh address signal RFA<0:11> has its bits all initialized, returning to an initial state of the low level. Subsequently, responsively at each timing at which refresh clock RCLK is activated, refresh address signal RFA<0:11> is again counted up.

With reference again to FIG. 9, register circuit 150 holds the summation of the number of regular word lines and that of spare word lines, i.e., a value of each bit of refresh address signal RFA<0:11> corresponding to a count value of 2048+ 8=2056 in the third embodiment of the present invention.

Compare circuits 140-0 to 140-11 are provided for the bits of refresh address signal RFA<0:11>, respectively, and compares the 12-bit data held in register circuit 150 and the bits of refresh address signal RFA<0:11>, respectively, to determine whether they match.

Compare circuits 140-0 to 140-11 output detection signals MC<0> to MC<11>, respectively, reflecting a result of comparing a bit with a respective bit to determine whether the bits match. Detection signals MC<0> to MC<11> are activated or driven high when in their respective match detection circuits the bits to be compared have their respective levels matching.

Match detection circuit 160 receives detection signals MC<0> to MC<11> and if the 12 detection signals are all activated then match detection circuit 160 activates match detection signal MCA or drives it high.

For example, compare circuits 140-0 to 140-11 can be configured of a 2-input AND circuit and match detection circuit 160 can be configured of a 12-input AND circuit.

Reset circuit 130 activates reset signal RS when match detection signal MCA is activated or the counter circuit counts a value indicated by refresh address signal RFA<0:11> that reaches the total number of regular word lines and spare word lines. Reset circuit 130 is only required to be configured of a CK flip flop operating responsively at a timing at which refresh clock RCLK is inactivated (a timing of refresh clock RCLK transitioning from high to low), and receiving match detection signal MCA as an input.

Counter circuit 120 responds to reset signal RS, which is input to a reset terminal RST, being activated, by resetting the bits of refresh address signal RFA<0:11> all low in level to initialize a count value.

Note that if a control signal NRF is further provided to prevent a spare word line from being refreshed and refresh generation circuit 100 further includes a signal level fixing circuit 125 provided to constantly fix low a one bit RFA<11> of a refresh address signal when control signal NRF is active, then refresh generation circuit 100 can also be used when it does not refresh a spare word line. Control signal NRF is only required to be activated in the normal mode of operation for example in response to self refresh command SREF or auto refresh command AREF being produced in such case.

Figure 11:
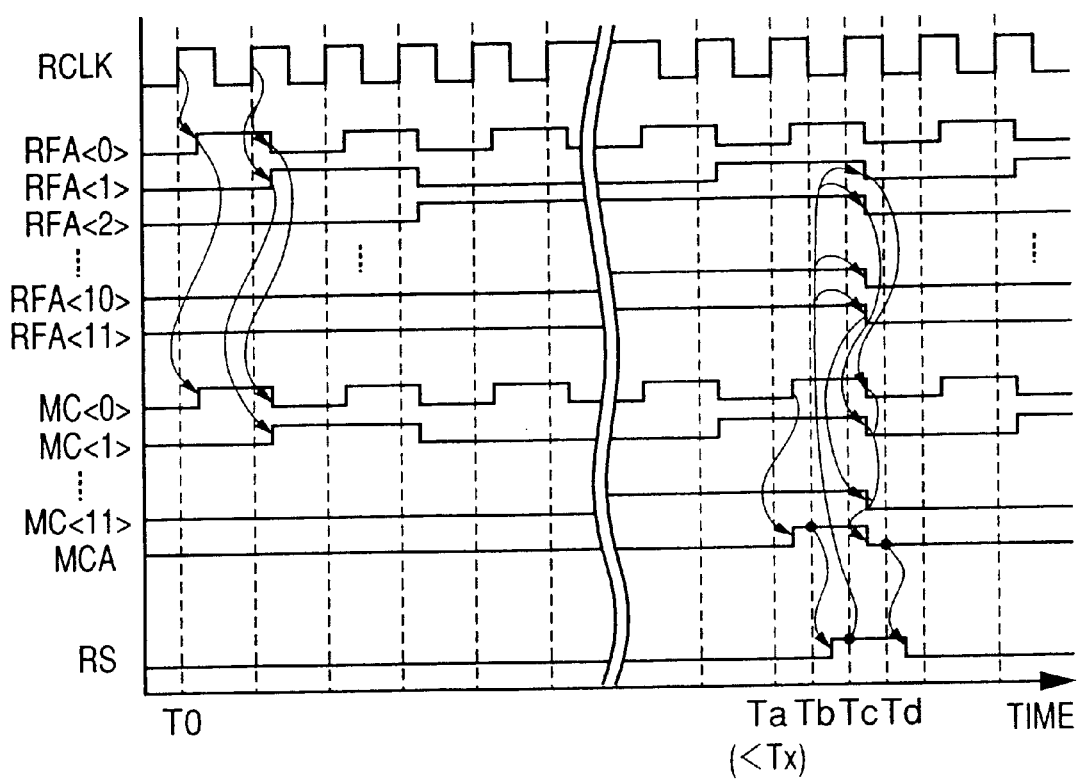
FIG. 11 is timing plots for illustrating an operation of refresh address generation circuit 100.
Figure 12:
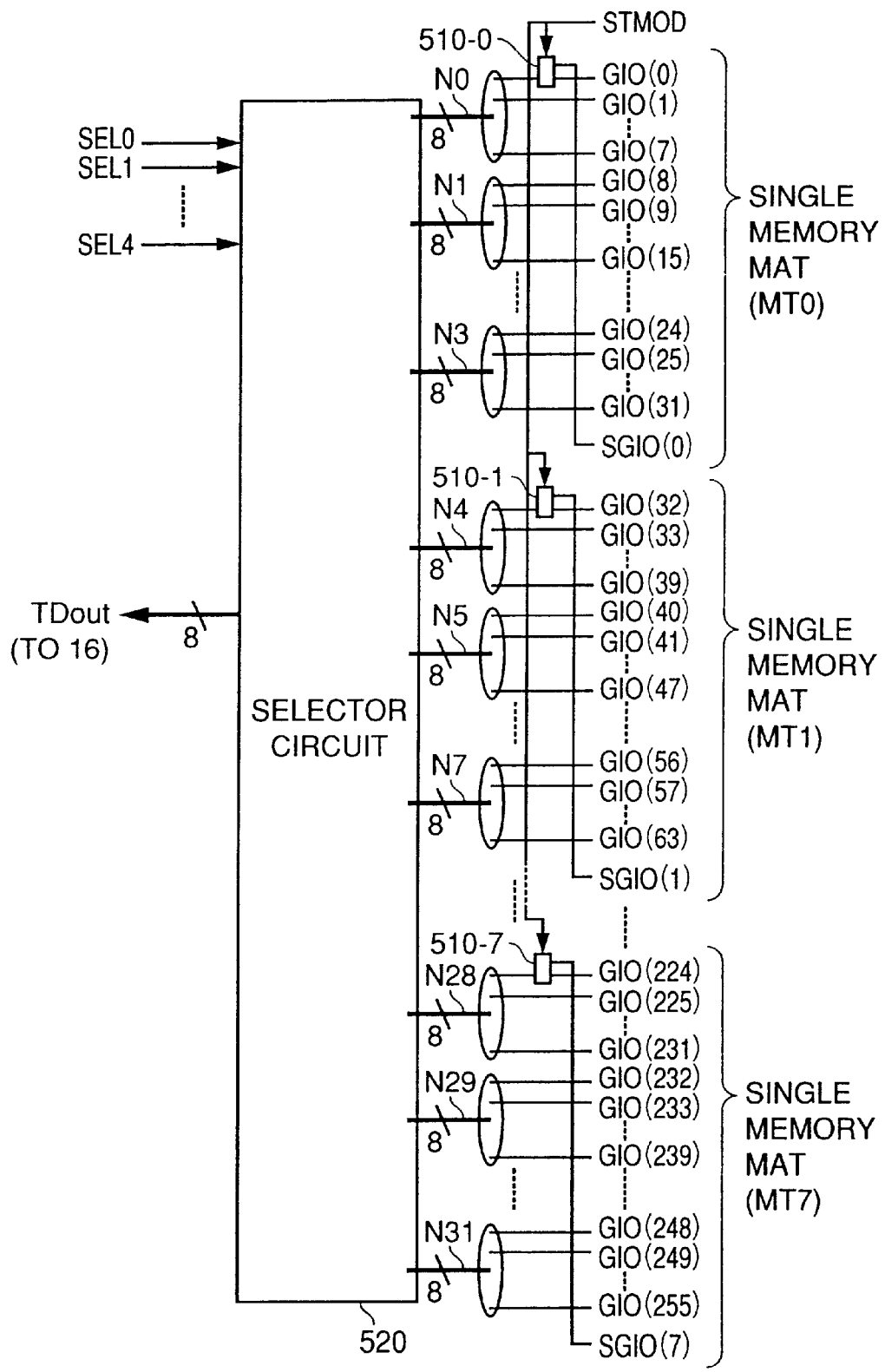
FIG. 12 is a block diagram for illustrating conventionally selecting data output in a testing operation.

With reference to FIG. 11, at time T0 or a timing at which refresh clock RCLK is activated an operation counting up refresh address signal RFA<0:11> starts. As the refresh address signal has each bit thereof transitioning in state, compare circuits 140-0 to 140-11 output detection signals MC<0> to MC<11> varying in level, as appropriate, although it is not until a count value indicated by refresh address signal RFA<0:11> reaches a predetermined value corresponding to the total number of regular word lines and spare word lines held in register circuit 150 that detection signals MC<0> to MC<11> all go high in level.

If at time Ta, a time preceding time Tx, at which the FIG. 10 count value reaches a full value, a count value indicated by refresh address signal RFA<0:11> reaches the total number of regular word lines and spare word lines, then between refresh address signal RFA<0:11> and the 12-bit data held in register circuit 150 each bit matches in level and compare circuits 140-0 to 140-11 respectively output detection signals MC<0> to MC<11> all set high. Thus, match detection signal MCA is activated or driven high.

Responsively at time Tb, corresponding to a timing at which refresh clock RCLK is inactivated (a timing of refresh clock RCLK transitioning from high to low), reset circuit 130 activates or drives reset signal RS from low to high.

Accordingly, at time Tc, corresponding to a timing at which refresh clock RCLK is subsequently activated, refresh address signal RFA<0:11> is reset and all the bits are set low in level. Refresh address signal RFA<0:11> reset no longer matches the data held in register circuit 150. As such, at least one of detection signals MC<0> to MC<11> is inactivated or driven low and match detection signal MCA is again inactivated or driven from high to low.

Responsively at time Td, corresponding to a timing at which refresh dock RCLK is inactivated (driven from high to low), reset circuit 130 again inactivates or drives reset signal RS low. Responsively at a timing at which refresh clock RCLK is subsequently activated an operation counting up refresh address signal RFA<0:11> is resumed.

As such, refresh address generation circuit 100 in the test mode can also test spare word lines SWL0 to SWL7 as a subject of a refresh operation.

Furthermore, providing register circuit 150 to hold a predetermined value corresponding to the total number of regular word lines and spare word lines allows a refresh address signal to have more bits than an externally input address signal by one bit to select a spare word line, while eliminating an unnecessary counting-up operation.

Furthermore, as has been described previously, of a refresh address signal RFA<11> indicative of selecting a spare word line can be fixed in level in a mode other than a mode testing a spare memory cell, to allow refresh address generation circuit 100 to be also used in the mode other than the mode testing the spare memory cell.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device outputting N data for one read operation in a test mode, N representing a natural number, comprising:

a memory cell array divided into a plurality of memory mats, each said memory mat including a plurality of regular memory cells arranged in rows and columns and a plurality of spare memory cells provided to substitute and thus repair a defect of said plurality of regular memory cells;

a plurality of regular data input/output lines provided to transmit data input to and output from said plurality of regular memory cells;

a plurality of spare data input/output lines provided to transmit data input to and output from said plurality of spare memory cells;

a first testing output select circuit operable in said test mode to output N data transmitted on N regular data input/output lines of said plurality of regular data input/output lines;

a second testing output select circuit operable in said test mode to output N data transmitted on N spare data input/output lines of said plurality of spare data input/output lines; and a third testing output select circuit operable to selectively output either one of an output of said first testing output select circuit and an output of said second testing output select circuit depending on whether said plurality of regular memory cells or said plurality of spare memory cells are to be tested in said test mode.

2. The semiconductor memory device according to claim 1, wherein for an entirety of said memory cell array there are provided N said spare input/output lines.

3. The semiconductor memory device according to claim 1, wherein:

said memory cell array is divided into N said memory mats; and said plurality of spare data input/output lines are provided, one for each said memory mat.

4. A semiconductor memory device comprising:

a memory cell array having a plurality of regular memory cells and a plurality of spare memory cells arranged in rows and columns;

a first input node receiving a plurality of control signals;

a second input node receiving in a test mode a voltage level indicating whether said plurality of regular memory cells or said plurality of spare memory cells are to be tested;

a command decode circuit taking therein an input received by said first input node and an input received by said second input node, and responding to a combination in level of said plurality of control signals and a level in voltage of said second input node to produce an operation command for said memory cell array, said command decode circuit producing an independent said operation command depending on whether said plurality of regular memory cells or said plurality of spare memory cells are subject to a predetermined said operation command instructed for said memory cell array.

5. The semiconductor memory device according to claim 4, wherein when said plurality of control signals combined in level indicate one of said read operation, said write operation and said row-selection activating operation, said command decode circuit responds to the level in voltage of said second input node to produce either one of said operation command for said plurality of regular memory cells and said operation command for said plurality of spare memory cells.

6. A semiconductor memory device comprising:

a memory cell array having a plurality of regular memory cells and a plurality of spare memory cells arranged in rows and columns;

L regular word lines arranged corresponding to rows of said plurality of regular memory cells, respectively, L being a natural number represented by $2^{M-1}<L\leq 2^M$, M being a natural number;

N spare word lines arranged corresponding to rows of said plurality of memory cells, respectively, N being a natural number less than $2^M$;

a refresh address generation circuit generating a refresh address signal of (M+1) bits corresponding to a count value counted up in a predetermined period; and a word line drive circuit selectively activating at least one of said L regular word lines and N spare word lines, said word line drive circuit operating in response to said refresh address signal of (M+1) bits when a refresh operation is instructed in a test mode.

7. The semiconductor memory device according to claim 6, wherein:

said refresh address signal has a predetermined one bit set at a first level when said L regular word lines are to be activated and at a second level when said N spare word lines are to be activated; and said refresh address generation circuit includes a potential fixing circuit operable in a normal mode of operation to fix said predetermined one bit of said refresh address signal at said first level.

8. The semiconductor memory device according to claim 6, wherein said refresh address generation circuit includes:

a clock generation portion generating a refresh clock repeating in said predetermined period a first state transition from a first state to a second state and a second state transition from said second state to said first state;

a counter circuit responding to one of said first and second state transitions of said refresh clock to count up said count value reflected in said refresh address signal of (M+1) bits;

a register circuit holding as an upper limit of said count value a number (L+N) corresponding to a total of a number of said regular word lines and a number of said spare word lines; and a reset circuit forcing said count value to return to an initial value when said count value matches said upper limit of said count value.

9. The semiconductor memory device according to claim 8, wherein:

said register circuit holds a value of each respective bit of said refresh address signal corresponding to said upper limit of said count value;

said refresh address generation circuit also includes a compare portion each provided for a respective bit of said refresh address signal and outputting a result of comparing said refresh address signal with data held in said register circuit to determine whether a bit of said refresh address signal matches in level a corresponding bit of the data held in said register circuit, and a match detection portion activating a match detection signal only when in each said compare portion the bit of said refresh address signal matches in level the corresponding bit of the data held in said register circuit;

said reset circuit responds to the other one of said first and second state transitions of said refresh clock to reflect a level of said match detection signal in a reset signal; and said counter circuit responds to said reset signal activated, to set all bits of said refresh address signal at a predetermined level corresponding to said initial value.

* * * * *